(12) United States Patent
Shafer

(10) Patent No.: US 7,508,284 B2
(45) Date of Patent: Mar. 24, 2009

(54) HYBRID LOW PASS DIPLEX FILTER

(75) Inventor: Steven Shafer, Chittenango, NY (US)

(73) Assignee: John Mezzalingua Associates, Inc., East Syracuse, NY (US)

( * ) Notice: Subject to any disclaimer, the term of this patent is extended or adjusted under 35 U.S.C. 154(b) by 234 days.

(21) Appl. No.: 11/468,640

(22) Filed: Aug. 30, 2006

(65) Prior Publication Data

US 2008/0055017 A1    Mar. 6, 2008

(51) Int. Cl.
*H03H 7/01* (2006.01)
(52) U.S. Cl. .................................. 333/132; 333/175
(58) Field of Classification Search ................ 333/132, 333/175, 176, 172, 174, 185
See application file for complete search history.

(56) References Cited

U.S. PATENT DOCUMENTS

| 5,157,362 A | 10/1992 | Zelenz |
| 5,745,838 A * | 4/1998 | Tresness et al. ............. 725/128 |
| 6,842,086 B1 | 1/2005 | Zennamo, Jr. |

\* cited by examiner

*Primary Examiner*—Daniel D Chang
(74) *Attorney, Agent, or Firm*—Christopher R. Pastel; Pastel Law Firm

(57) ABSTRACT

A hybrid diplex bandstop filter includes a lowpass filter circuit which passes a first range of frequencies and a highpass filter circuit passes a third range of frequencies. The filter blocks a second range of frequencies. The third range of frequencies is higher than the second range and the first range. A tuning circuit tunes at least one re-resonance of a frequency inside the first range of frequencies to either within the second range of frequencies or outside an industry specified upper limit which is in the third range of frequencies.

26 Claims, 9 Drawing Sheets

US 7,508,284 B2

HYBRID LOW PASS DIPLEX FILTER

FIELD OF THE INVENTION

This invention relates generally to the field of diplex filters used in cable television systems, and more particularly to a low pass diplex filter which reduces high pass resonance.

BACKGROUND OF THE INVENTION

A diplex circuit, or more simply a "diplexer," is a device which separates or combines RF signals. Diplexers are used in connection with CATV equipment in a number of situations, some of which use two diplexers back-to-back. These include step attenuators, power bypass circuits, cable simulators and equalizer circuits. Many of the prior art CATV diplex circuits are used to act on signals traveling in so-called forward and return paths, e.g., relatively high frequency RF signals pass from a source of such signals to a television set at subscriber premises in the forward direction over one leg of the circuit while lower frequency (DC) signals pass from the premises in the return direction.

Bandstop or "notch" filters are commonly employed in the CATV industry to block transmission of signals in a specified frequency range. For example, certain channels may be designated as premium channels, requiring payment of a fee from the subscriber in order to receive the signals carrying information representing such channels. If the service is not ordered, i.e., the fee is not paid, an appropriate filter is installed in the cable line coming into the non-paying premises. This is but one of the more traditional uses of bandstop filters, i.e., as a so-called trap. A more recent example is the aforementioned use in the handling of forward and return path signals between a head end and subscriber facilities.

Using typical minimum inductor or capacitor design techniques in the lowpass leg of a diplex bandstop filter creates a problem in achieving a flat upper passband, thus causing return loss and increased delay. The capacitor and coil combination that is used to make up the low frequency lowpass filter contains capacitors and coils that are extremely large in value. In fact, the values are large enough to create multiple re-resonances in the upper passband of the highpass leg of the filter, which are undesirable. See, for example, FIG. 1.

SUMMARY OF THE INVENTION

Briefly stated, a hybrid diplex bandstop filter includes a lowpass filter circuit which passes a first range of frequencies and a highpass filter circuit passes a third range of frequencies. The filter blocks a second range of frequencies. The third range of frequencies is higher than the second range and the first range. A tuning circuit times at least one re-resonance of a frequency inside the first range of frequencies to either within the second range of frequencies or outside an industry specified upper limit which is in the third range of frequencies.

According to an embodiment of the invention, a hybrid diplex bandstop filter includes means for allowing a first range of frequencies to pass through the filter from an input to an output; means for blocking a second range of frequencies from passing through the filter from the input to the output, wherein the second range of frequencies is higher than the first range of frequencies; means for allowing a third range of frequencies to pass through the filter from the input to the output; wherein the third range of frequencies is higher than the second range of frequencies; and tuning means for tuning at least one re-resonance of a frequency within the first range of frequencies to either within the second range of frequencies or outside an industry specified upper limit within the third range of frequencies.

According to an embodiment of the invention, a hybrid diplex bandstop filter includes a lowpass filter circuit which allows a first range of frequencies to pass through the filter from an input to an output; a bandstop circuit which blocks a second range of frequencies from passing through the filter from the input to the output, wherein the second range of frequencies is higher than the first range of frequencies; a highpass filter circuit which allows a third range of frequencies to pass through the filter from the input to the output, wherein the third range of frequencies is higher than the second range of frequencies; and a tuning circuit which tunes at least one re-resonance of a frequency within the first range of frequencies to either within the second range of frequencies or outside an industry specified upper limit within the third range of frequencies.

According to an embodiment of the invention, a method of manufacturing a hybrid bandstop filter includes the steps of: (a) making a lowpass filter circuit which allows a first range of frequencies to pass through the filter from an input to an output; (b) making a bandstop filter circuit which prevents a second range of frequencies from passing through the filter from the input to the output; wherein the second range of frequencies is higher than the first range of frequencies; (c) making a highpass filter circuit which allows a third range of frequencies to pass through the filter from the input to the output, wherein the third range of frequencies is higher than the second range of frequencies; and (d) making a tuning circuit which tunes at least one re-resonance of a frequency within the first range of frequencies to either within the second range of frequencies or outside an industry specified upper limit within the third range of frequencies.

DETAILED DESCRIPTION OF THE PREFERRED EMBODIMENT

Figure 1:
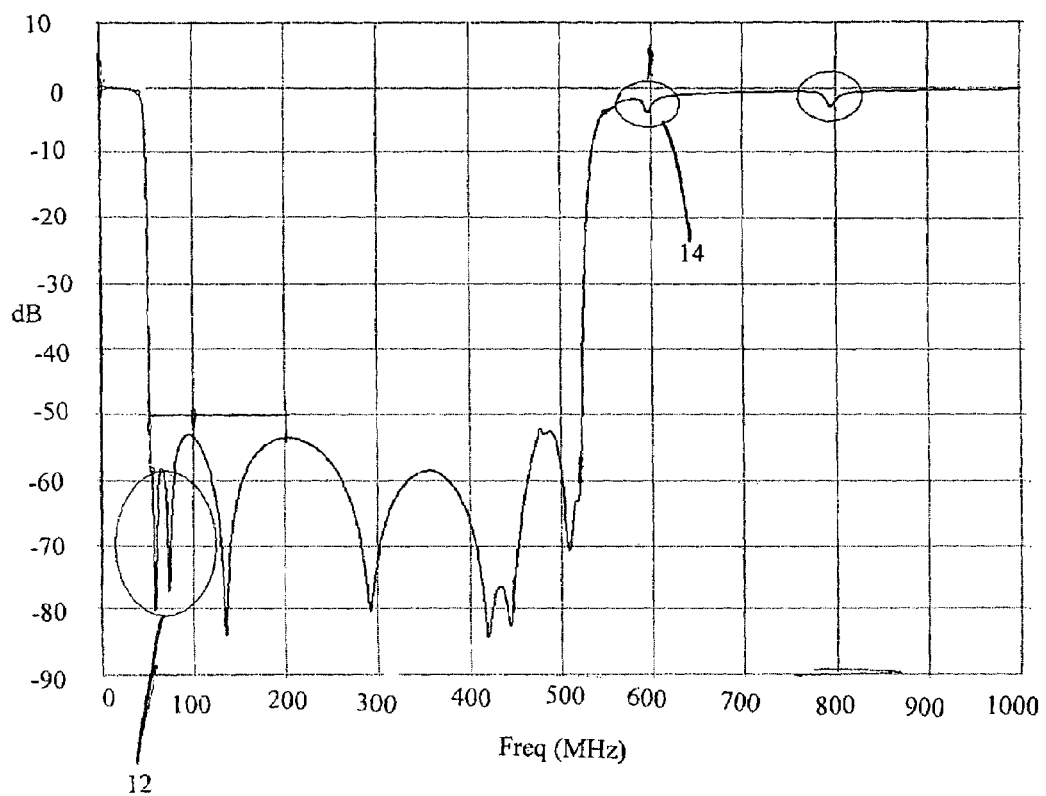
FIG. 1 shows a frequency performance chart of a typical diplex filter.

Referring to FIG. 1, the typical prior art minimum inductor or minimum capacitor design in the lowpass leg of a diplex bandstop filter creates a problem in achieving a flat upper passband, thus causing poor return loss and increased delay. This problem arises because the capacitors and coils used in combination to make the low frequency lowpass leg are extremely large in value, causing multiple re-resonances in the upper passband of the highpass leg of the filter. For example, the primary resonance at around 55.25 MHZ, as identified by reference numeral 12, causes a re-resonance at around 550 MHz as identified by reference numeral 14.

As known in the art, the lowpass leg of a diplex bandstop filter is one of four types: (1) minimum capacitor filter, (2) minimum inductor filter, (3) minimum inductor elliptic function filter, and (4) minimum capacitor elliptic function filter. In the present invention, a hybrid filter is defined as a filter which is a hybrid of at least two of these four filter types.

Figure 2:
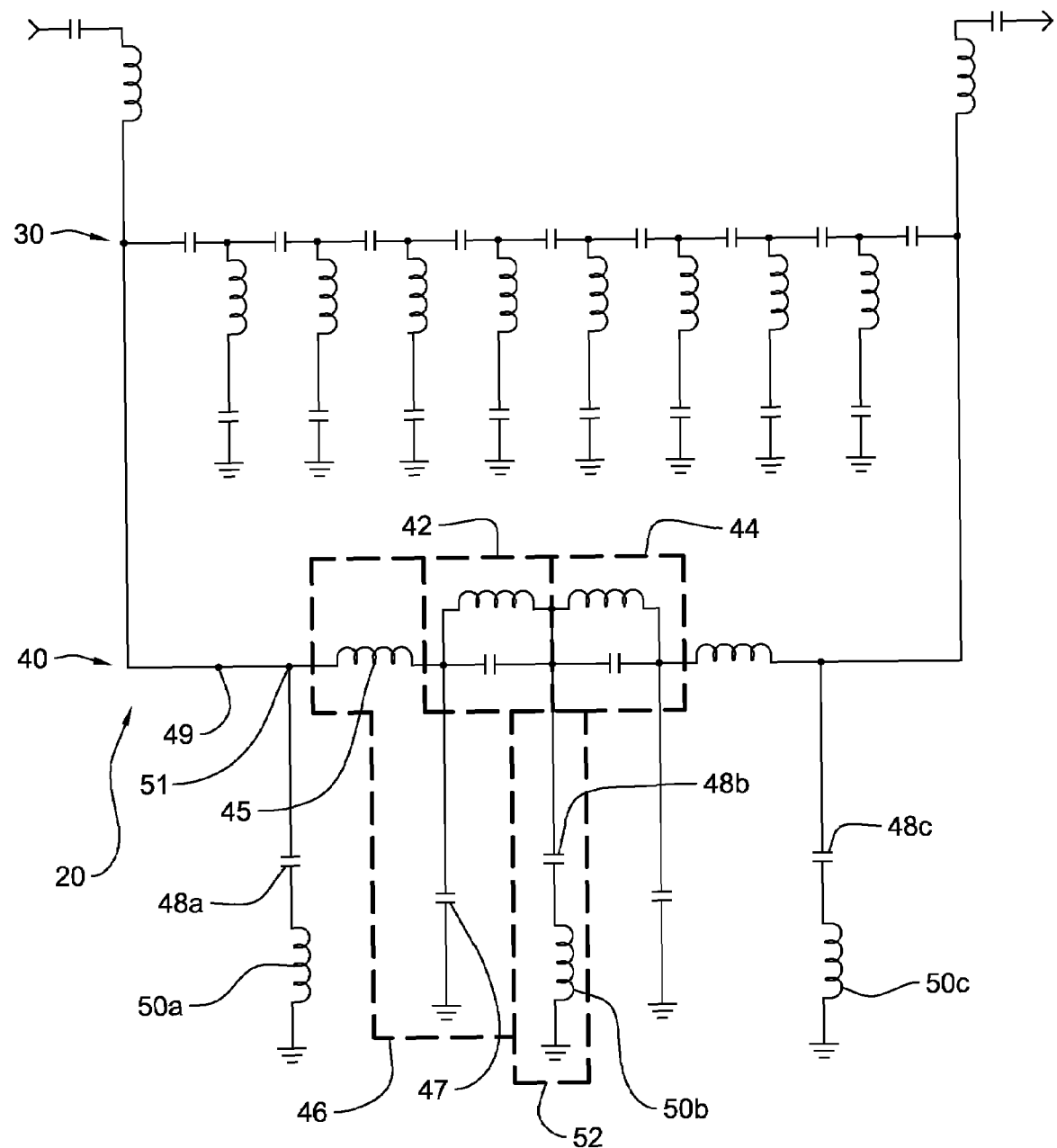
FIG. 2 shows a hybrid low pass diplex filter according to a first embodiment of the invention.

Referring to FIG. 2, an embodiment of the present invention includes a hybrid diplex filter 20 with an upper passband leg 30 and a lower passband leg 40. Resonance tanks 42 and 44 in series are indicative of a minimum inductance elliptic function filter, whereas an LC combination 46 (which consists of an inductor 45 and a capacitor 47) is indicative of a minimum inductance filter. The combination of a capacitance shunt 48 with the LC combination 46 forms a typical lowpass Pi filter. In the present invention, inductors 50a, 50b, and 50c are added in series with capacitance shunts 48a, 48b, and 48c, respectively, to locate the re-resonance of filter 20 higher than any one of the four types of typical filters (minimum capacitance, minimum inductance, minimum inductance elliptic, and minimum capacitance elliptic) can by itself. The goal is to locate the re-resonances outside whatever the current industry specified upper limit of usable bandwidth in the cable industry is. For example, the first industry specified upper limit was 216 MHz; at the present time the industry specified upper limit is 860 MHz in the United States, but some systems go to 1.0 Ghz. The industry specified upper limit for Japan is 2.185 GHz because of the manner in which satellite and cable are combined. As far as is known, the techniques of the present invention can be used to tune at least one re-resonance from a frequency within the lowpass filter range to outside the industry specified upper limit, no matter what the upper limit is.

The circuit of this embodiment is useful when the lowpass filter has a cutoff below 200 MHz. The circuit of this embodiment has fewer parasitics than the prior art designs, because it breaks up the circuit so that the loading is less.

Note that the circuit of lower passband leg 40 is symmetrical about a middle capacitance shunt 52, so description concerning the right half of lower passband leg 40 is omitted. Additional sections can be added in pairs, i.e., on the right side and on the left side of lower passband leg 40 to make the filter sharper. For example, the section on the left side would consist of another inductor in series with a shunt capacitor similar to the capacitance shunt 48a and inductor 50a combination but connected at a point 49, with another inductor similar to inductor 45 connected between point 49 and a point 51. A symmetrical section would also be added on the right side of the circuit.

Figure 3:
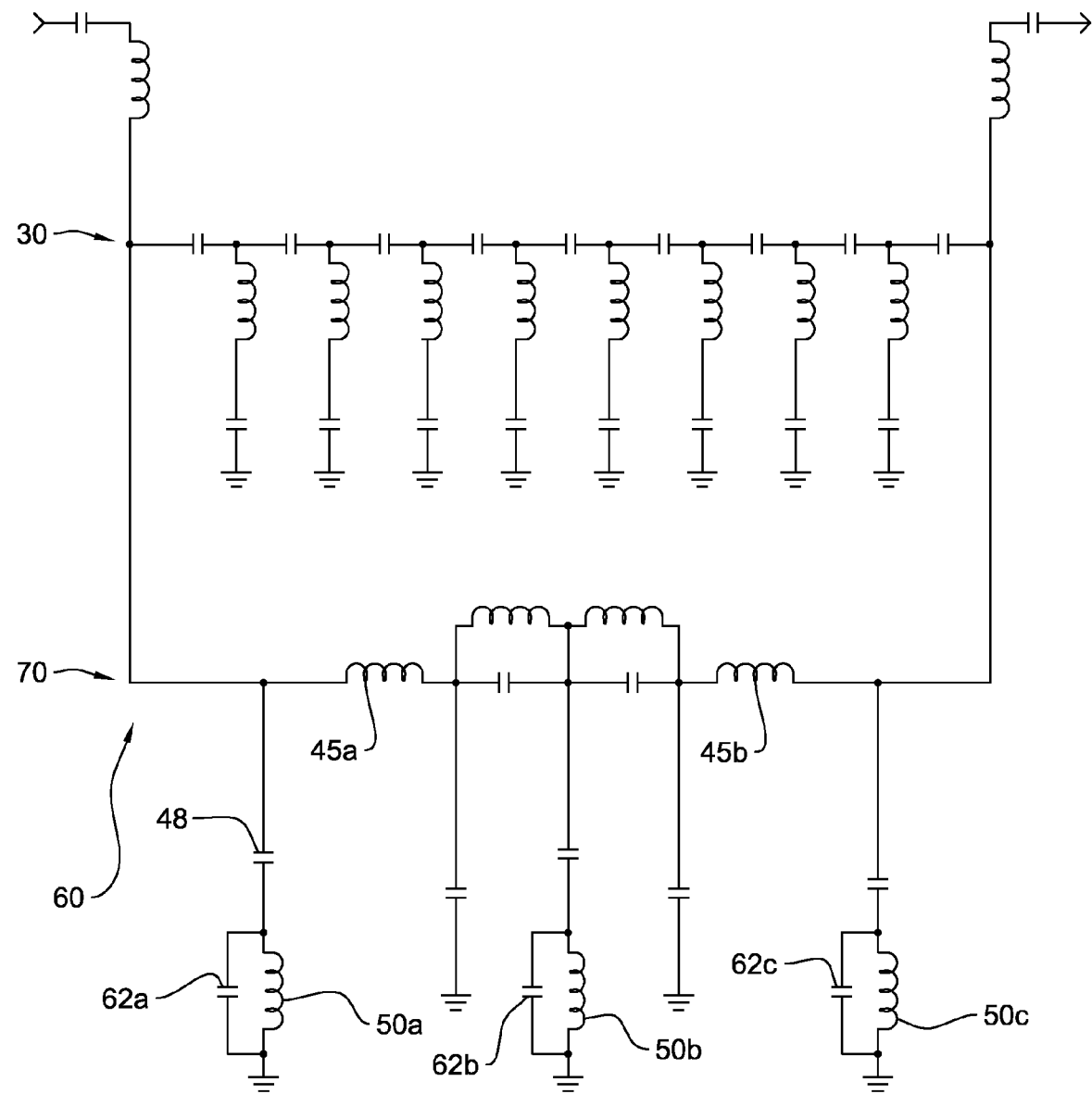
FIG. 3 shows a hybrid low pass diplex filter according to a second embodiment of the invention.

Referring to FIG. 3, a hybrid diplex filter 60 includes upper passband leg 30 and a lower passband leg 70. Lower passband leg 70 is similar to lower passband leg 40 of FIG. 2, but has tuning capacitors 62a, 62b, and 62c across inductors 50a, 50b, and 50c, respectively. Adding tuning capacitors 62a, 62b, and 62c to lower passband leg 70 in this manner adds capacitance to inductors 50a, 50b, and 50c and lowers the resonance of inductors 50a, 50b, and 50c. This embodiment moves the re-resonance lower into the stop band of filter 60.

Figure 4:
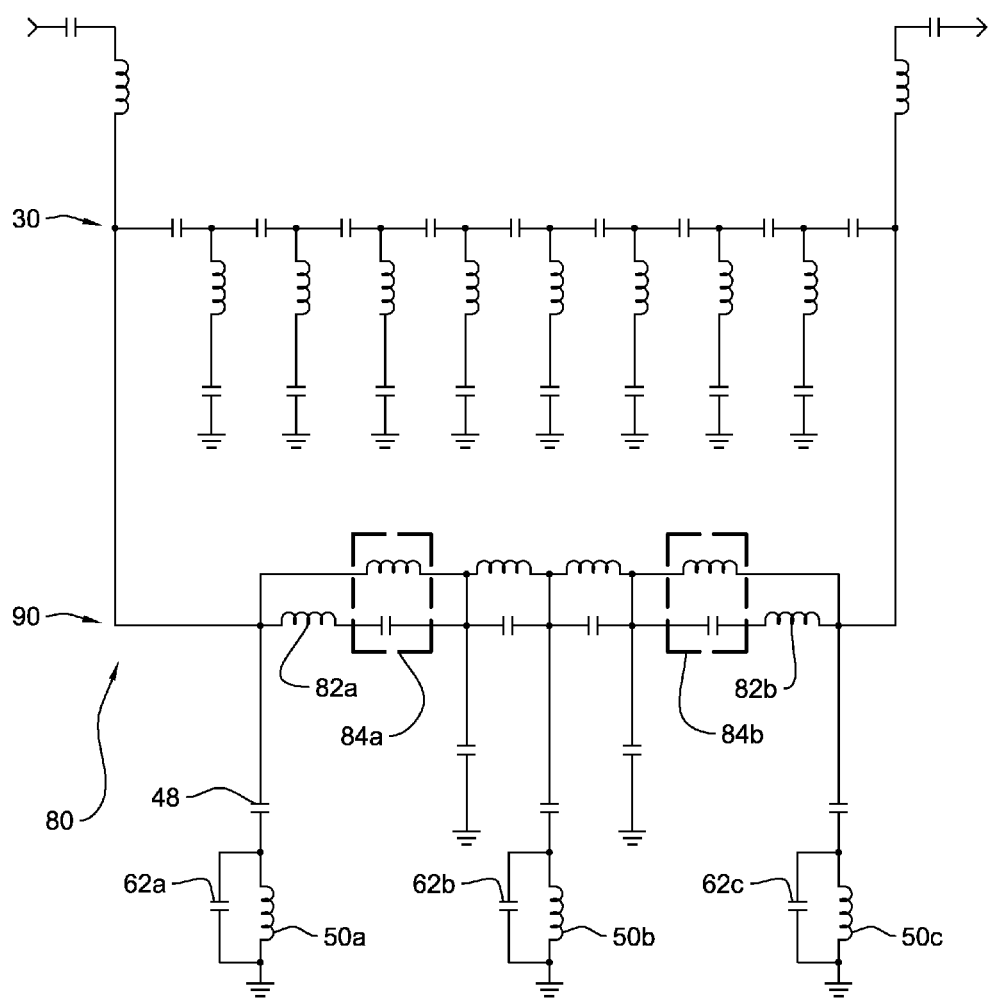
FIG. 4 shows a hybrid low pass diplex filter according to a third embodiment of the invention.

Referring to FIG. 4, a hybrid diplex filter 80 includes upper passband leg 30 and a lower passband leg 90. Lower passband leg 90 is similar to lower passband leg 70 of FIG. 3, but includes tuning inductors 82a and 82b which tune tank circuits 84a and 84b, respectively, down into the stop band by increasing the loading inductance.

Figure 5:
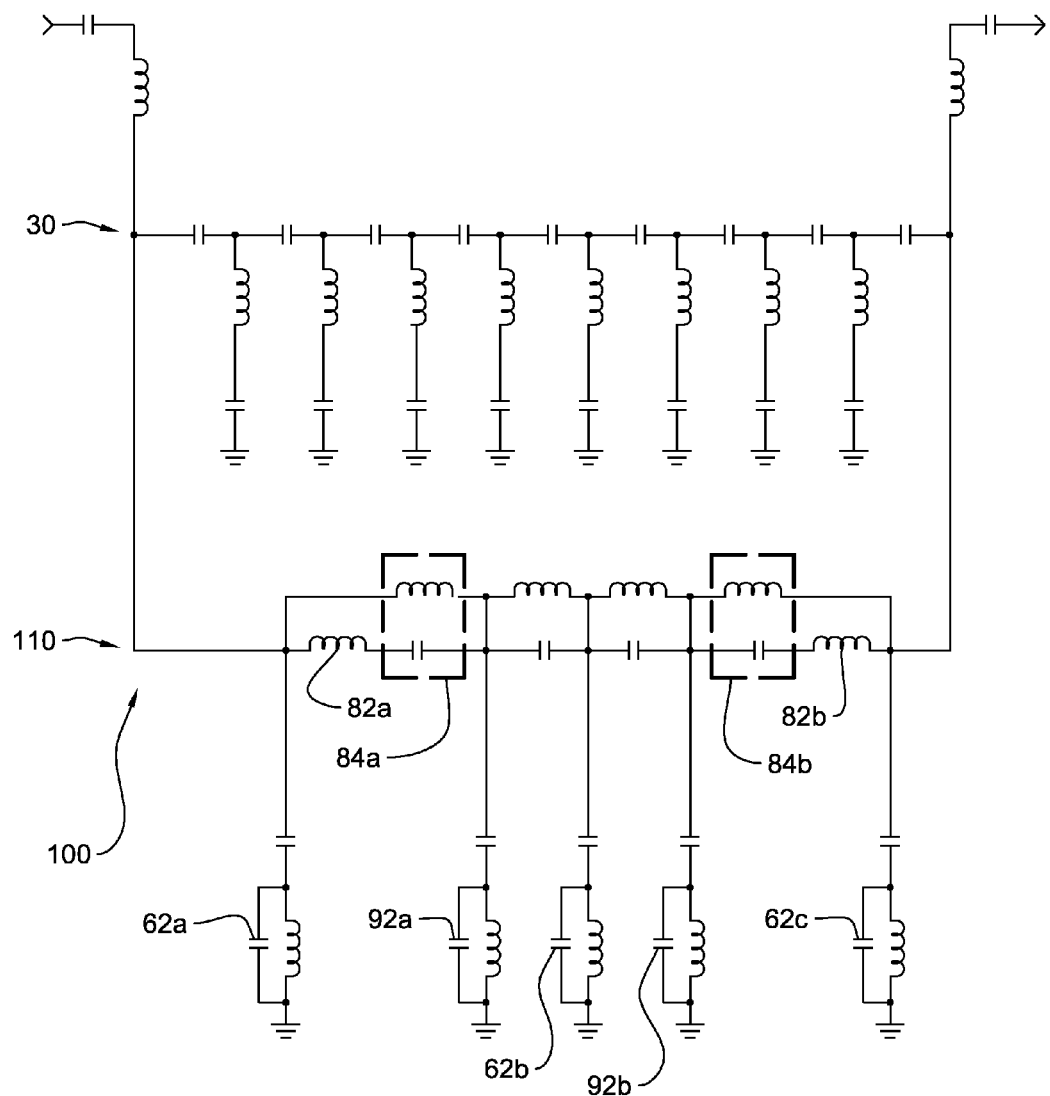
FIG. 5 shows a hybrid low pass diplex filter according to a fourth embodiment of the invention.

Referring to FIG. 5, a hybrid diplex filter 100 includes upper passband leg 30 and a lower passband leg 110. Lower passband leg 110 is similar to lower passband leg 90 in FIG. 4 in that it includes tuning inductors 82a and 82b which tune tank circuits 84a and 84b, respectively, as well as tuning capacitors 62a, 62b, and 62c, but differs from the previous embodiments in that it includes additional tuning capacitors 92a, 92b which have the effect of further tuning the waveform produced by lower passband leg 110 and making the waveform sharper.

Figure 6:
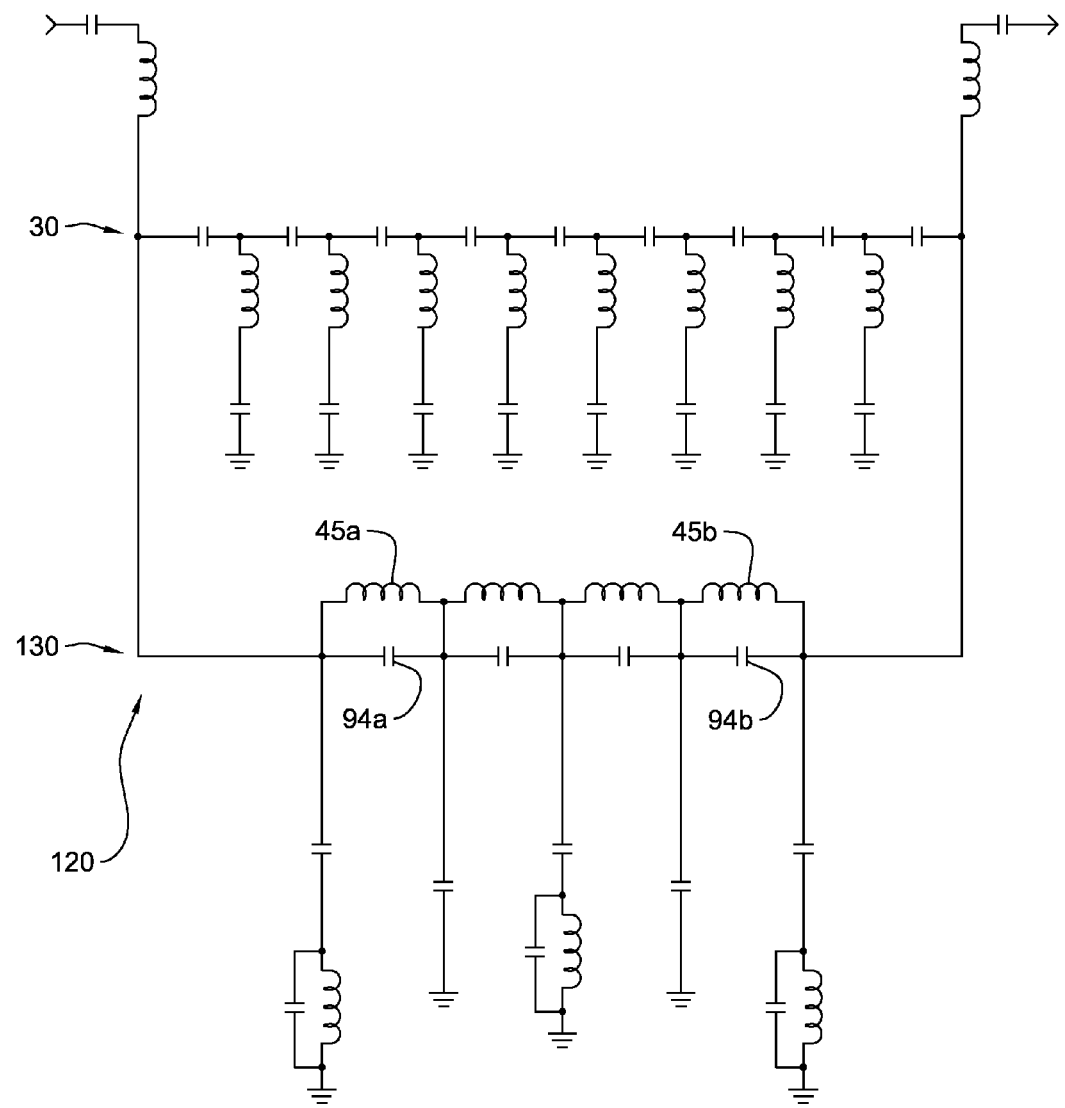
FIG. 6 shows a hybrid low pass diplex filter according to a fifth embodiment of the invention.

Referring to FIG. 6, a hybrid diplex filter 120 includes upper passband leg 30 and a lower passband leg 130. Lower passband leg 130 is similar to lower passband leg 70 of FIG. 3 but with capacitors 94a, 94b added in parallel with inductors 45a, 45b, which makes inductors 45a, 45b a notch filter section instead of a lowpass filter section. This embodiment makes the passband to stopband transition produced by the embodiment of FIG. 3 sharper.

Figure 7:
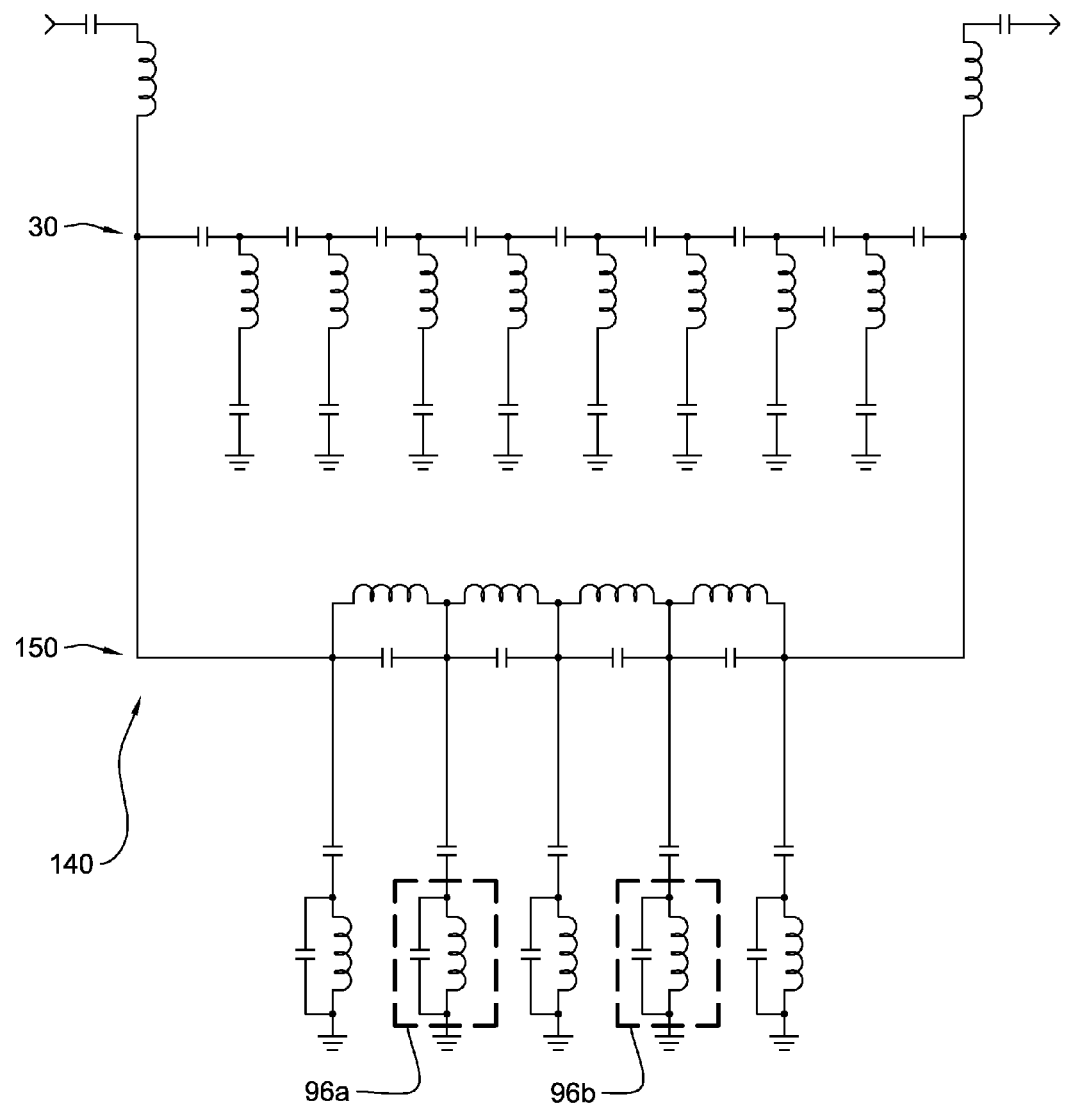
FIG. 7 shows a hybrid low pass diplex filter according to a sixth embodiment of the invention.

Referring to FIG. 7, a hybrid diplex filter 140 includes upper passband leg 30 and a lower passband leg 150. Lower passband leg 150 is similar to lower passband leg 130 of FIG. 6 but with more tanks to ground, i.e., by adding tanks 96a, 96b, which makes the passband to stopband transition sharper by tuning the re-resonance into the stop band.

Figure 8:
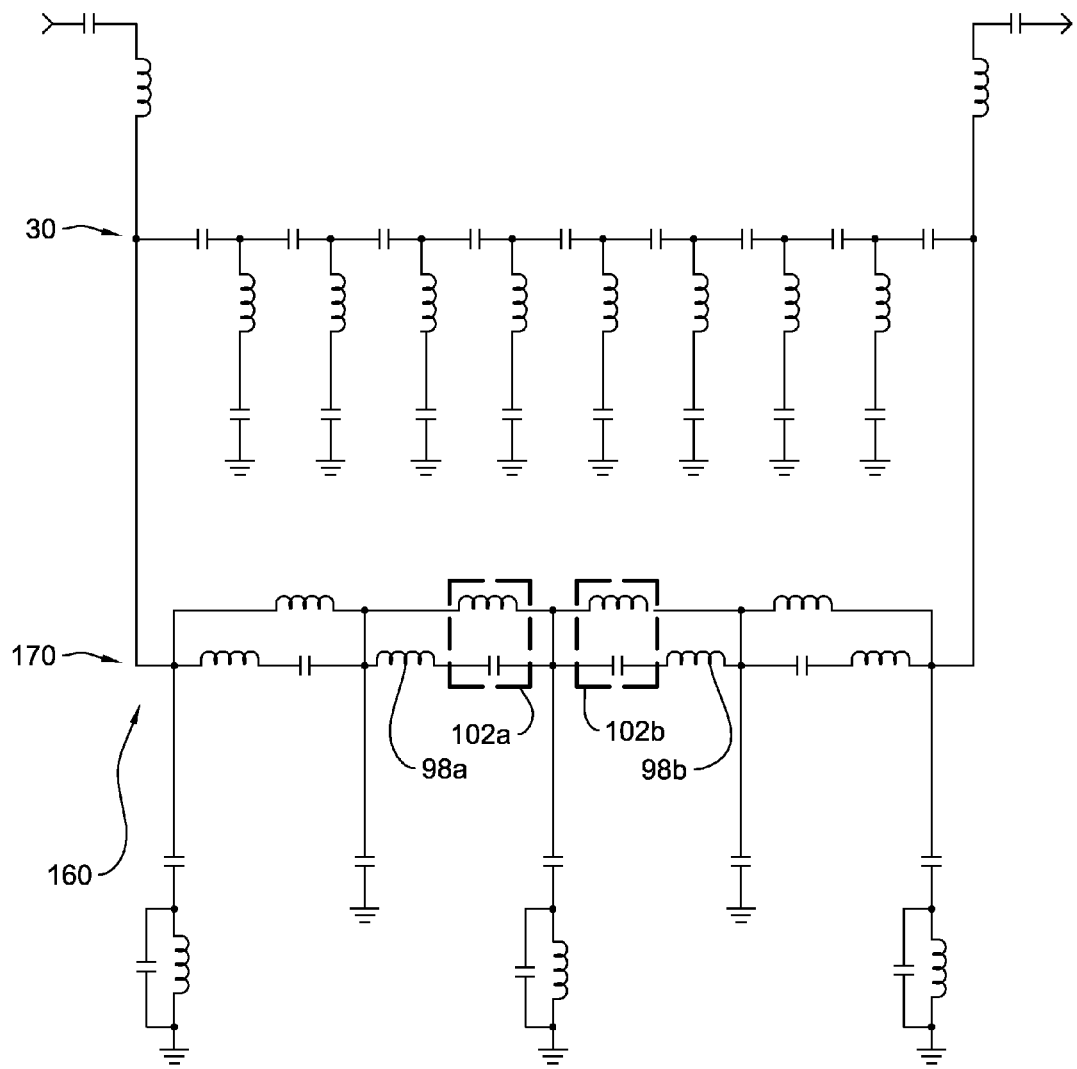
FIG. 8 shows a hybrid low pass diplex filter according to a seventh embodiment of the invention.

Referring to FIG. 8, a hybrid diplex filter 160 includes upper passband leg 30 and a lower passband leg 170. Lower passband leg 170 is similar to lower passband leg 90 of FIG. 4 but with tuning inductors 98a, 98b added to tank circuits 102a, 102b respectively to further sharpen the passband to stopband transition produced by the embodiment of FIG. 4.

Figure 9:
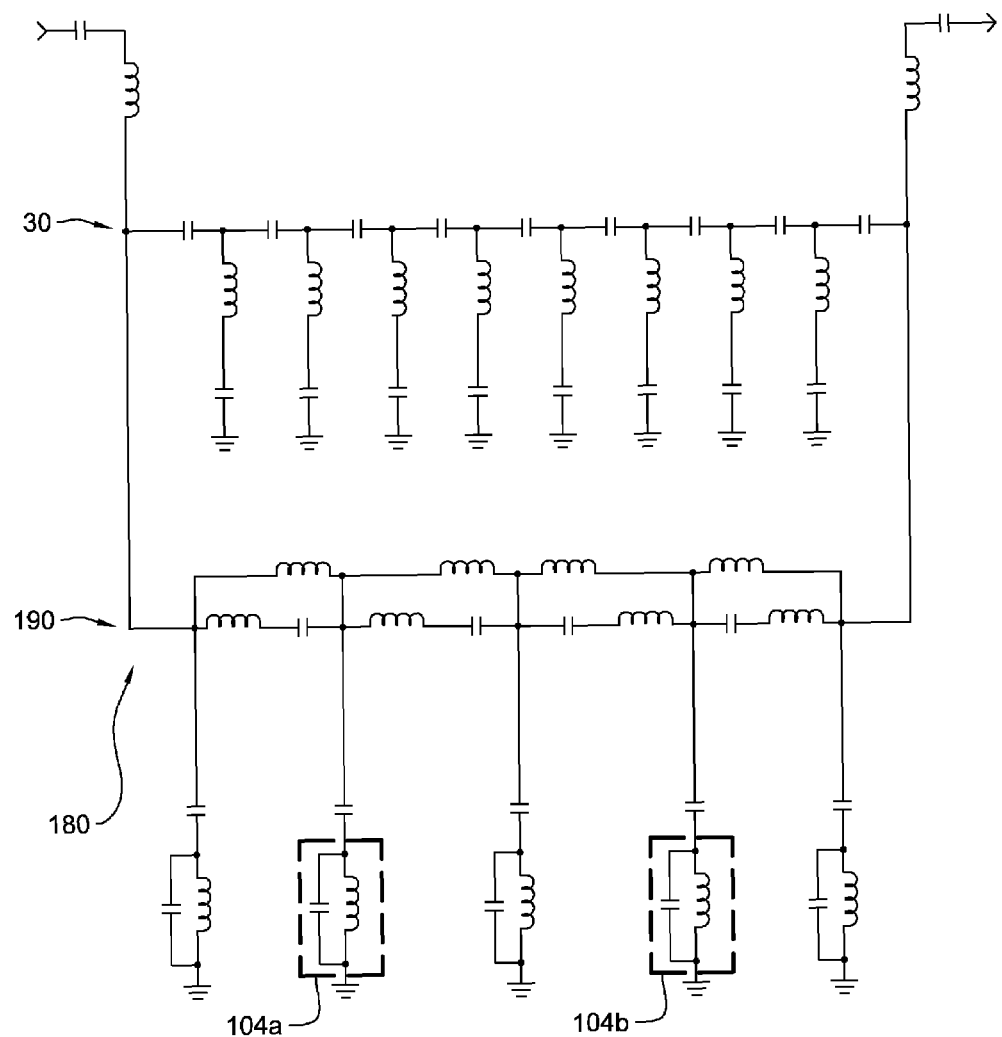
FIG. 9 shows a hybrid low pass diplex filter according to a eighth embodiment of the invention.

Referring to FIG. 9, a hybrid diplex filter 180 includes upper passband leg 30 and a lower passband leg 190. Lower passband leg 190 is similar to lower passband leg 170 of FIG. 8 but with additional tank circuits 104a, 104b to ground, which has the effect of tuning more re-resonances down into the stop band.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

What is claimed is:

1. A hybrid diplex bandstop filter; comprising:
    means for allowing a first range of frequencies to pass through the filter from an input to an output;
    means for blocking a second range of frequencies from passing through the filter from the input to the output, wherein the second range of frequencies is higher than the first range of frequencies;
    means for allowing a third range of frequencies to pass through the filter from the input to the output; wherein the third range of frequencies is higher than the second range of frequencies; and
    tuning means for tuning at least one re-resonance of a frequency within the first range of frequencies to either within the second range of frequencies or outside an industry specified upper limit within the third range of frequencies.

2. A filter according to claim 1, wherein the tuning means includes an inductor in series between a capacitor shunt pole and a ground.

3. A filter according to claim 1, wherein the tuning means includes a tank circuit in series between a capacitor shunt pole and a ground.

4. A filter according to claim 1, wherein the tuning means includes a first tank circuit in series with a second tank circuit, the first tank circuit includes an inductor in series with a capacitor, and the tuning means further includes a tank circuit in series between a capacitor shunt pole and a ground.

5. A filter according to claim 1, wherein the tuning means includes a first tank circuit in series with a second tank circuit, the first tank circuit includes an inductor in series with a capacitor, and the tuning means further includes a tank circuit in series between all capacitor shunt poles and a ground.

6. A filter according to claim 1, wherein the tuning means includes a first tank circuit in series with a second tank circuit and the tuning means further includes a tank circuit in series between a capacitor shunt pole and a ground.

7. A filter according to claim 1, wherein the tuning means includes a first tank circuit in series with a second tank circuit, the first tank circuit includes an inductor in series with a first capacitor, the second tank circuit includes an inductor in series with a second capacitor, and the tuning means further includes a tank circuit in series between a capacitor shunt pole and a ground.

8. A filter according to claim 1, wherein the tuning means includes a first tank circuit in series with a second tank circuit, the first tank circuit includes an inductor in series with a first capacitor, the second tank circuit includes an inductor in series with a second capacitor, and the tuning means further includes a tank circuit in series between all capacitor shunt poles and a ground.

9. A filter according to claim 1, wherein the industry specified upper limit is 1.0 GHz.

10. A hybrid diplex bandstop filter; comprising:
    a lowpass filter circuit which allows a first range of frequencies to pass through the filter from an input to an output;
    a bandstop circuit which blocks a second range of frequencies from passing through the filter from the input to the output, wherein the second range of frequencies is higher than the first range of frequencies;
    a highpass filter circuit which allows a third range of frequencies to pass through the filter from the input to the output, wherein the third range of frequencies is higher than the second range of frequencies; and
    a tuning circuit which tunes at least one re-resonance of a frequency within the first range of frequencies to either within the second range of frequencies or outside an industry specified upper limit within the third range of frequencies.

11. A filter according to claim 10, wherein the tuning circuit includes an inductor in series between a capacitor shunt pole and a ground.

12. A filter according to claim 10, wherein the tuning circuit includes a tank circuit in series between a capacitor shunt pole and a ground.

13. A filter according to claim 10, wherein the tuning circuit includes a first tank circuit in series with a second tank circuit, the first tank circuit includes an inductor in series with a capacitor, and the tuning means further includes a tank circuit in series between a capacitor shunt pole and a ground.

14. A filter according to claim 10, wherein the tuning circuit includes a first tank circuit in series with a second tank circuit, the first tank circuit includes an inductor in series with a capacitor, and the tuning means further includes a tank circuit in series between all capacitor shunt poles and a ground.

15. A filter according to claim 10, wherein the tuning circuit includes a first tank circuit in series with a second tank circuit and the tuning means further includes a tank circuit in series between a capacitor shunt pole and a ground.

16. A filter according to claim 10, wherein the tuning circuit includes a first tank circuit in series with a second tank circuit, the first tank circuit includes an inductor in series with a first capacitor, the second tank circuit includes an inductor in series with a second capacitor, and the tuning means further includes a tank circuit in series between a capacitor shunt pole and a ground.

17. A filter according to claim 10, wherein the tuning circuit includes a first tank circuit in series with a second tank circuit, the first tank circuit includes an inductor in series with a first capacitor, the second tank circuit includes an inductor in series with a second capacitor, and the tuning means further includes a tank circuit in series between all capacitor shunt poles and a ground.

18. A filter according to claim 10, wherein the industry specified upper limit is 1.0 GHz.

19. A method of manufacturing a hybrid bandstop filter; comprising the steps of:
    making a lowpass filter circuit which allows a first range of frequencies to pass through the filter from an input to an output;
    making a bandstop filter circuit which prevents a second range of frequencies from passing through the filter from the input to the output; wherein the second range of frequencies is higher than the first range of frequencies;
    making a highpass filter circuit which allows a third range of frequencies to pass through the filter from the input to the output, wherein the third range of frequencies is higher than the second range of frequencies; and
    making a tuning circuit which tunes at least one re-resonance of a frequency within the first range of frequencies to either within the second range of frequencies or outside an industry specified upper limit within the third range of frequencies.

20. A method according to claim 19, wherein the tuning circuit includes an inductor in series between a capacitor shunt pole and a ground.

21. A method according to claim 19, wherein the tuning circuit includes a tank circuit in series between a capacitor shunt pole and a ground.

22. A method according to claim 19, wherein the tuning circuit includes a first tank circuit in series with a second tank circuit, the first tank circuit includes an inductor in series with a capacitor, and the tuning means further includes a tank circuit in series between a capacitor shunt pole and a ground.

23. A method according to claim 19, wherein the tuning circuit includes a first tank circuit in series with a second tank circuit, the first tank circuit includes an inductor in series with a capacitor, and the tuning means further includes a tank circuit in series between all capacitor shunt poles and a ground.

24. A method according to claim 19, wherein the tuning circuit includes a first tank circuit in series with a second tank circuit and the tuning means further includes a tank circuit in series between a capacitor shunt pole and a ground.

25. A method according to claim 19, wherein the tuning circuit includes a first tank circuit in series with a second tank circuit, the first tank circuit includes an inductor in series with a first capacitor, the second tank circuit includes an inductor in series with a second capacitor, and the tuning means further includes a tank circuit in series between a capacitor shunt pole and a ground.

26. A method according to claim 19, wherein the tuning circuit includes a first tank circuit in series with a second tank circuit, the first tank circuit includes an inductor in series with a first capacitor, the second tank circuit includes an inductor in series with a second capacitor, and the tuning means further includes a tank circuit in series between all capacitor shunt poles and a ground.

* * * * *